(12) United States Patent
Zhu et al.

(10) Patent No.: US 7,741,680 B2
(45) Date of Patent: Jun. 22, 2010

(54) ELECTRO-STATIC DISCHARGE AND LATCHUP RESISTANT SEMICONDUCTOR DEVICE

(75) Inventors: Haiyang Zhu, Stoneham, MA (US); David Foley, Chelmsford, MA (US)

(73) Assignee: Analog Devices, Inc., Norwood, MA (US)

( * ) Notice: Subject to any disclaimer, the term of this patent is extended or adjusted under 35 U.S.C. 154(b) by 122 days.

(21) Appl. No.: 12/191,028

(22) Filed: Aug. 13, 2008

(65) Prior Publication Data

US 2010/0038718 A1    Feb. 18, 2010

(51) Int. Cl.
*H01L 23/58* (2006.01)
(52) U.S. Cl. ................ 257/357; 257/343; 257/375; 257/376; 257/E21.379; 257/E21.544; 257/E21.696
(58) Field of Classification Search .......... 257/343, 257/357, 375–376; 438/309, 322
See application file for complete search history.

(56) References Cited

U.S. PATENT DOCUMENTS 4,825,275 A    4/1989  Tomassetti 6,160,304 A  * 12/2000  Ludikhuize ............... 257/549
6,600,199 B2    7/2003  Voldman et al.

FOREIGN PATENT DOCUMENTS

JP        11-87692    *  3/1999
KR      2002015199    *  2/2002

OTHER PUBLICATIONS

PCT International Search Report and Written Opinion for PCT/US2009/50524 mailed on Sep. 3, 2009.

* cited by examiner

*Primary Examiner*—A. Sefer
(74) *Attorney, Agent, or Firm*—Kenyon & Kenyon LLP

(57) ABSTRACT

The present invention relates to a semiconductor device including a substrate layer, a metal-oxide-semiconductor field-effect transistor (MOSFET), a backgate region, an isolation layer and a diode. The MOSFET includes a gate region, a source region and a drain region. The source and drain regions are embedded in the backgate region, which includes a voltage input terminal. The isolation layer is located between the backgate region and the substrate layer and has a doping type opposite that of the backgate region. The diode includes a first terminal connected to the isolation layer and a second terminal coupled to an isolation voltage source.

24 Claims, 9 Drawing Sheets

ELECTRO-STATIC DISCHARGE AND LATCHUP RESISTANT SEMICONDUCTOR DEVICE

BACKGROUND INFORMATION

Isolated metal-oxide-semiconductor field-effect transistors (MOSFETs) differ from conventional MOSFETs in that isolated transistors include a voltage isolating layer between a substrate and a transistor well (backgate). An advantage of the isolated transistor is that different bias potentials may be applied to the substrate and the backgate simultaneously. For example, a common application of isolated transistors involves setting the substrate to Ground, e.g., 0 volts, while applying a supply voltage, e.g., −8 volts, to the backgate. The isolation layer electrically isolates devices situated within the same substrate. Transistors and other semiconductor devices may be formed on the same substrate and operated at different voltages without interfering with each other. FIG. 1 is a cross-sectional view of a conventional semiconductor device 10 including an isolated NMOS transistor, which includes an n-type source region 11, an n-type drain region 12 and a gate 13. The NMOS transistor is formed within a p-type backgate which includes a heavily doped p+ region 14 to which a bias voltage may be applied. An n-type isolation layer 16 separates the backgate from a substrate 17 which includes a heavily doped p+ region 18 to which a substrate bias voltage may be applied. A resistor Riso 19 couples the isolation layer 16 to an isolation voltage Viso. A substrate voltage VSS is applied to the region 18 while a supply voltage VL is applied to the source 11 and the backgate region 14. The transistor may be activated by applying a bias voltage Vgate to the gate 13. The drain 12 is connected to an output Vout.

Although isolated MOSFETs are intended to provide complete electrical isolation, in practice complete isolation cannot be achieved because of parasitic circuit elements. Under certain operating conditions, the parasitic elements contribute to electrostatic discharge (ESD) and/or latchup failure in the device. ESD and latchup cause many failures in integrated circuits (ICs) including ICs that utilize isolated MOSFETs. Because ESD and latchup are independent and often competing factors in IC design, improved ESD performance often results in a corresponding worsened latchup performance, and vice versa.

SUMMARY

A first example embodiment of the present invention relates to a semiconductor device including a substrate layer and a metal-oxide-semiconductor field-effect transistor (MOSFET) including a gate region, a source region and a drain region. The semiconductor device also includes a backgate region including a voltage input terminal and in which the source region and the drain region are embedded, an isolation layer between the backgate region and the substrate layer, the isolation layer having a doping type opposite that of the backgate region, and a diode including a first terminal connected to the isolation layer and a second terminal coupled to an isolation voltage source.

A second example embodiment of the present invention relates to a method for constructing a semiconductor device, including the steps of forming an isolation layer in a semiconductor substrate, the isolation layer having a doping type opposite that of the substrate and forming a backgate region on an outermost surface of the isolation layer such that the backgate region is separated from the substrate. The method also includes the steps of forming a MOSFET including source and drain regions embedded within the backgate region and forming a diode adjacent to the MOSFET, the diode including a first terminal connected to the isolation layer and a second terminal coupled to an isolation voltage source.

DETAILED DESCRIPTION OF EXAMPLE EMBODIMENTS

Figure 1:
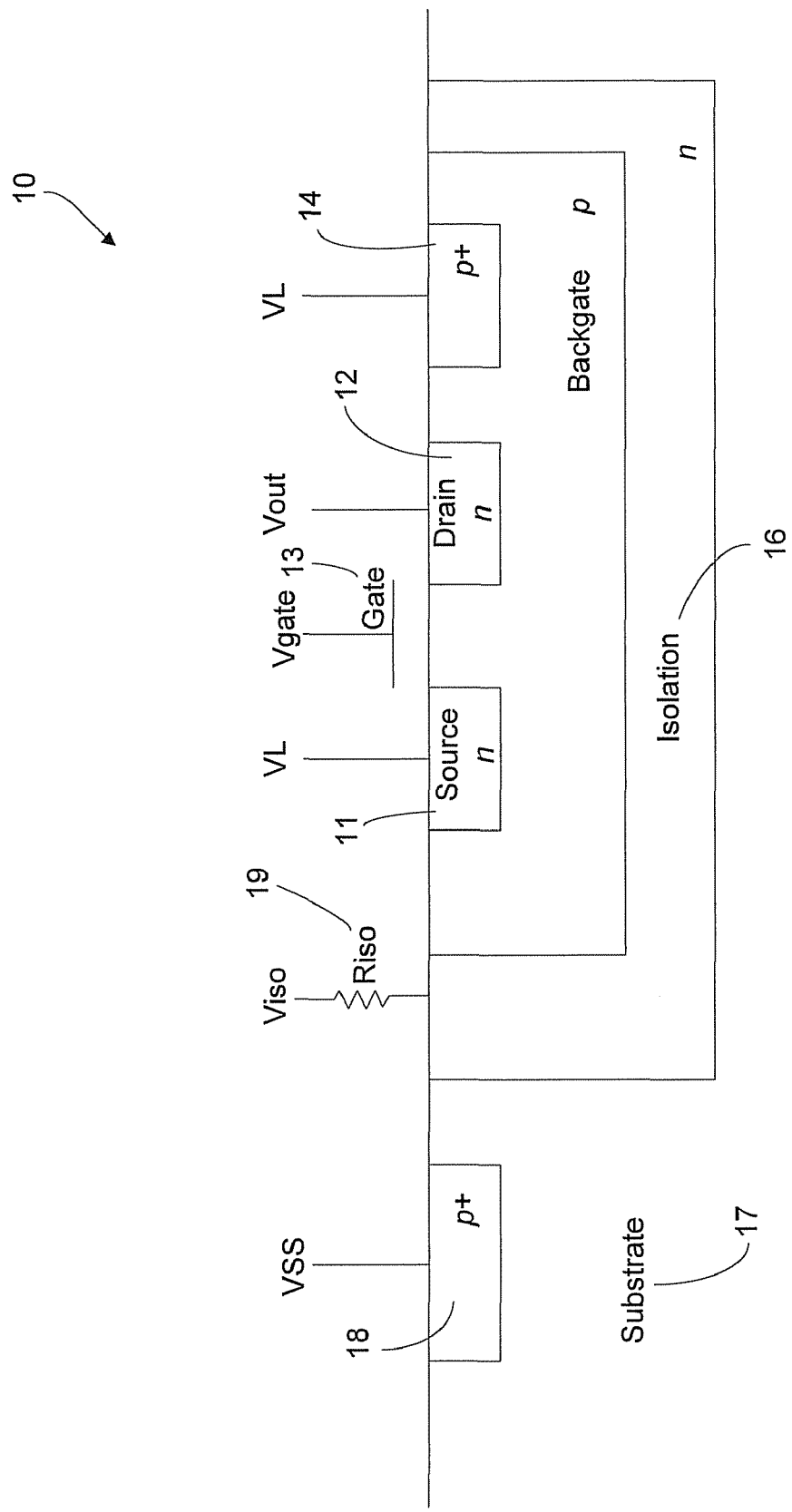
FIG. 1 shows a conventional semiconductor device.
Figure 2:
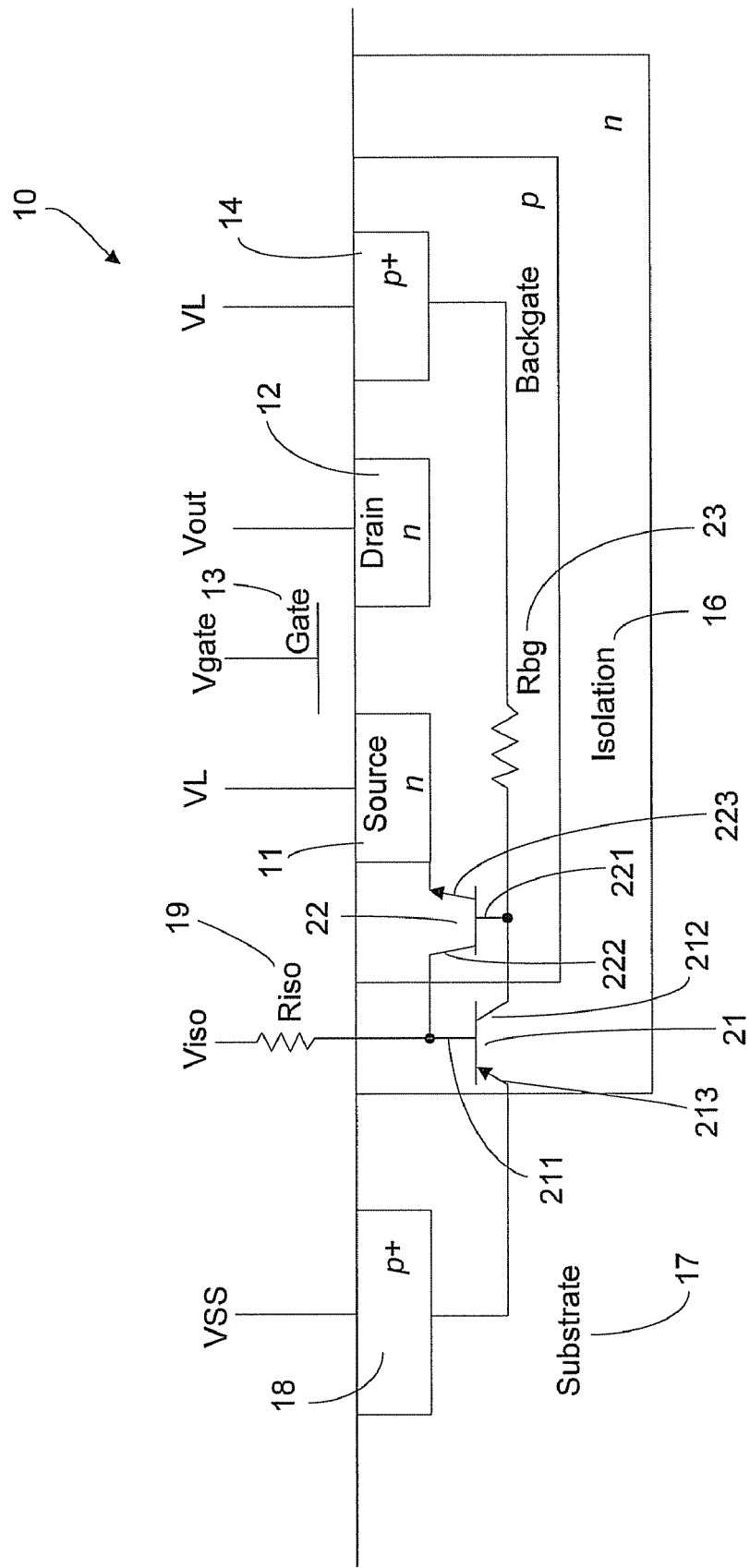
FIG. 2 shows a model of the semiconductor device of FIG. 1 including parasitic elements.

FIG. 2 shows a model of the semiconductor device 10 which includes parasitic transistors 21 and 22. The transistors 21, 22 may be represented as bipolar junction transistors (BJTs). The configuration of the transistor 21 is that of a PNP-type BJT. As shown, the isolation layer 16 forms a base 211 of the transistor 21 while the backgate and the substrate 17 respectively form a collector 212 and an emitter 213 of the transistor 21. The configuration of the transistor 22 is that of an NPN-type BJT. The backgate forms a base 221 of the transistor 22.

The isolation layer 16 and the source 11 respectively form a collector 222 and an emitter 223 of the transistor 22.

The emitter 213 is coupled, via the substrate 17, to the substrate voltage VSS. The collector 212 is coupled to the base 221 of the transistor 22 and, via a parasitic resistor Rbg 23 of the backgate, to the supply voltage VL. The base 211 is coupled to the collector 222 of the transistor 22 and, via the isolation resistor Riso 19, to the isolation voltage Viso. The emitter 223 of the transistor 22 is coupled, via the source 11, to the supply voltage VL. As will be explained below, the interaction between the resistor Riso 19 and the parasitic elements 21, 22 and Rbg 23 effects a tradeoff between ESD and latchup performance.

Isolated NMOS devices such as the device 10 may often be used in applications where the drain voltage of a device must go below the substrate potential. Thus, the supply voltage VL may be less than the substrate potential VSS. For example, the substrate 17 may be a grounded substrate with VSS=0V and VL may be negative (e.g. −8V). In a normal operational state, the isolation potential Viso may be greater than or equal to the potentials of the substrate (VSS) and backgate (VL). The isolation potential Viso may be supplied from any direct current (DC) power supply producing the required voltage such as a digital supply voltage VDD (not shown). In an alternative example, the substrate potential VSS itself may be used to bias the isolation layer 16. That is, VSS=Viso.

The resistor Riso 19 may protect against ESD, which may occur as a result of applying voltage to different input-output (I/O) pin combinations during device testing. Without the resistor 19, an ESD traveling between the drain 12 and the isolation layer 16 may damage the drain 12 by generating stress resulting from high current between the drain voltage and Viso. Riso 19 may limit the current flowing between the drain 12 and the isolation layer 16. Selecting a large value for Riso 19 may allow less current to flow, thereby steering the current towards other, lower resistance paths to which the drain 12 and/or the isolation layer 16 may be coupled. For example, the current may flow from the drain 12 to another device connected thereto. The resistor Riso 19 may also protect against ESD between the source 11 and the isolation layer 16. Although a large Riso value may be desirable for ensuring adequate ESD protection, large resistor values may also degrade latchup performance. Latchup conditions will now be described with reference to FIG. 3.

Figure 3:
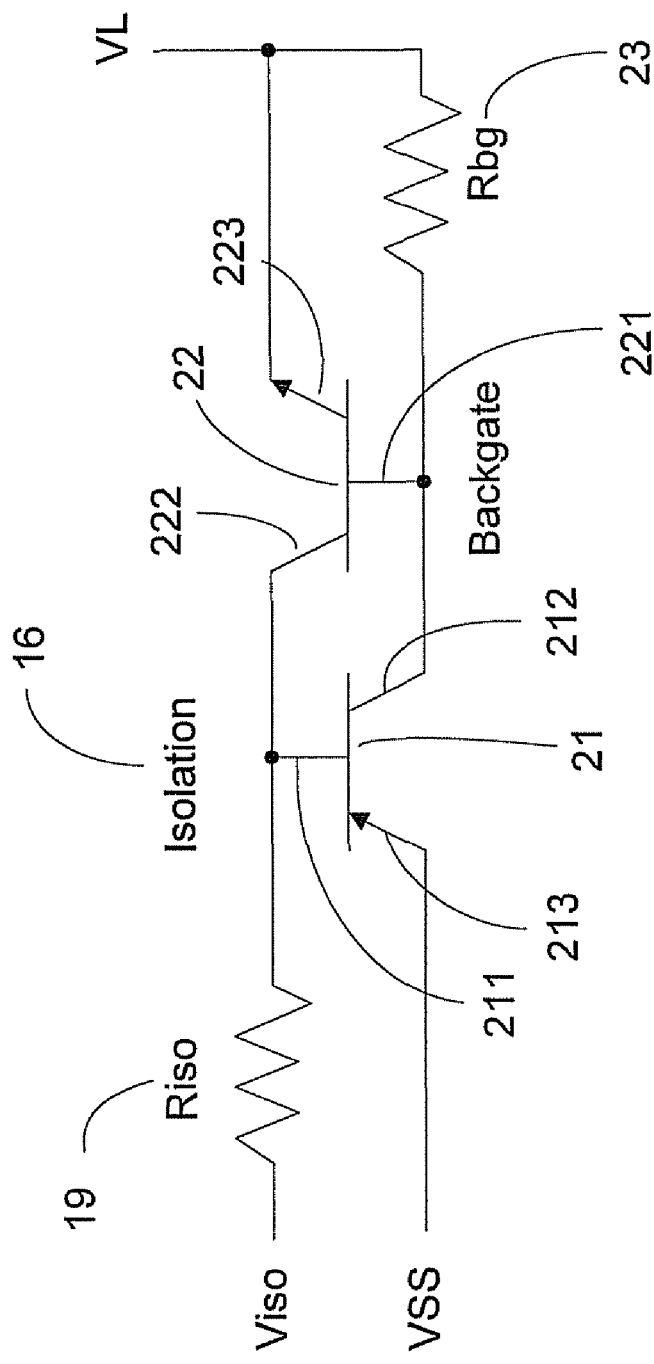
FIG. 3 shows a schematic view of the model of FIG. 2.

FIG. 3 shows a schematic view of the parasitic arrangement described above with reference to FIG. 2. As shown in FIG. 3, the resistor Riso 19 may couple the isolation voltage Viso to the base 211 of the transistor 21 and the collector 222 of the transistor 22. Latchup may occur when the transistors 21, 22 enter the forward active region of operation. Latchup conditions may occur during normal operations or during testing (e.g., as part of a manufacturing process). One example of a test condition that may trigger latchup conditions is a test described in the JESD78A document published by the Joint Electron Device Engineering Council (JEDEC). The test, known as I-test, involves coupling a trigger current source to the drain 12 to draw a trigger current (e.g., 100 mA) while the isolated NMOS transistor is in an off state. During this test, the PN junction between the drain 12 and the backgate becomes forward biased, causing electrons to be injected into the drain 12 and collected by the isolation layer 16. Thus, current flowing from Viso through Riso 19 may cause a voltage drop in the isolation layer 16. If the resistance of Riso 19 is sufficiently large, the voltage of the isolation layer 16 may drop below that of the substrate (i.e., the voltage of base 211 is less than VSS).

The drop below the substrate potential VSS in turn may cause the PN junction between the isolation layer 16 and the substrate 17 to become forward biased and the transistor 21 enters the forward active region, causing holes to be injected into the isolation layer 16 and collected by the backgate. Thus, current flowing to the backgate through the parasitic resistance Rbg 23 may increase the potential of the backgate. If the potential of the backgate is increased sufficiently high, the PN junction between the backgate and the source 11 becomes forward biased. At this point a latchup condition has occurred between the substrate 17 and the source 11 because both transistors 21, 22 are now in the forward active region, thereby creating a conducting path from VSS to the source 11 after the trigger current source is removed. If Riso 19 is small and the voltage drop of the isolation layer 16 is not low enough to cause the PN junction between the isolation layer 16 and the substrate 17 to become forward biased, the latchup condition may not occur. Thus, in contrast to ESD performance (where a large Riso value is preferred), latchup performance is optimized by selecting small Riso values.

Based on the above descriptions of ESD and latchup conditions, it will be understood that the value of Riso 19 must be chosen to achieve both the desired latchup and ESD performances. Because there is a tradeoff, balancing latchup and ESD performance may be difficult and in many cases both desired latchup performance and the desired ESD performance cannot be achieved simultaneously. In other cases, selecting the right Riso 19 value may require tedious calculations and/or trial-and-error.

As will now be discussed, a semiconductor device according to the present invention is not subject to ESD-Latchup tradeoff and may provide additional advantages over the semiconductor device 10. Although example embodiments of the present invention will be described with reference to isolated NMOS and PMOS transistors, in further examples, the present invention may be implemented with other semiconductor devices for which ESD and/or latchup performance is required.

Figure 4:
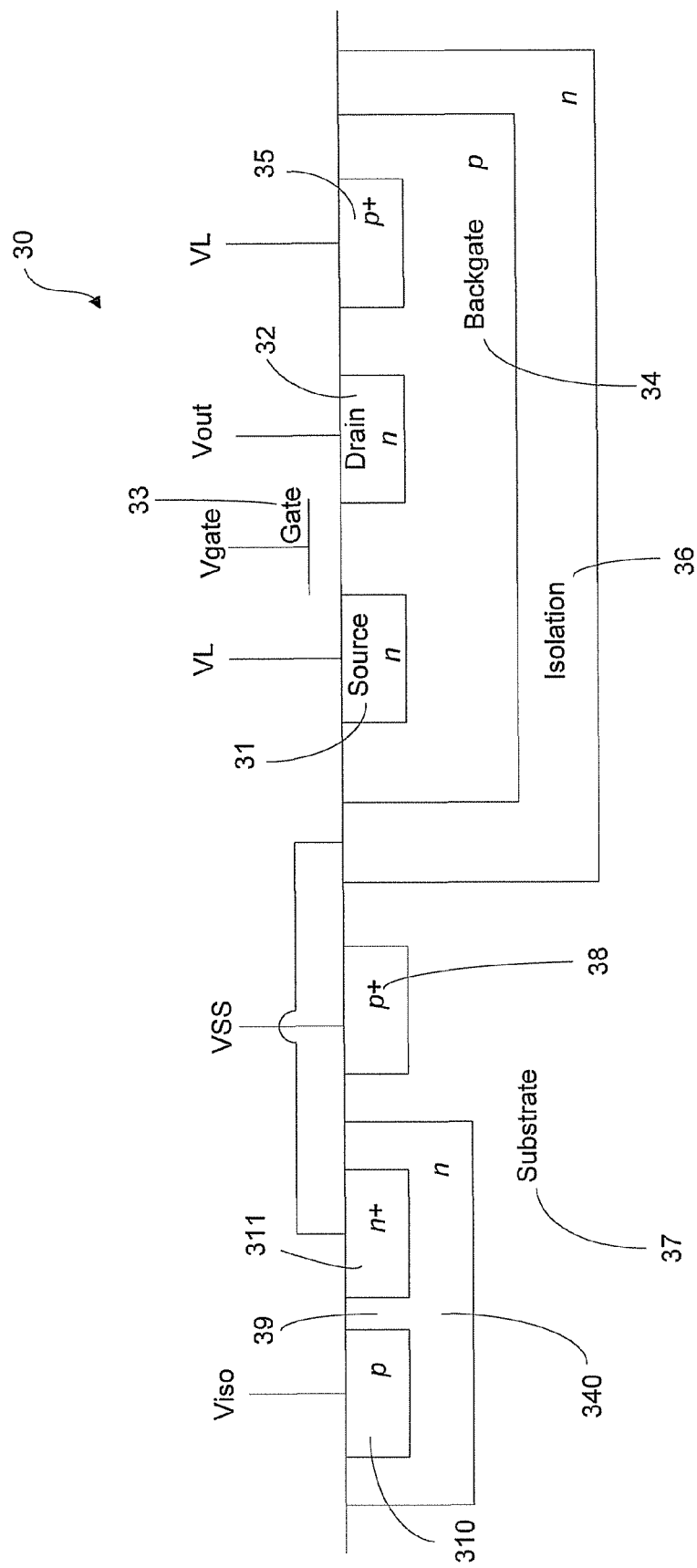
FIG. 4 shows an example semiconductor device according to an example embodiment of the present invention.

FIG. 4 shows a cross-sectional view of an example semiconductor device 30 according to an example embodiment of the present invention. The semiconductor device 30 may include a first portion comprising an NMOS transistor formed within a p-type substrate 37. The transistor may include an n-type source 31 and an n-type drain 32 formed within a p-type backgate 34. A supply voltage VL may be applied to the source 31. An output voltage Vout may be produced by the drain 32. The backgate 34 may include a heavily doped p+ region 35 to which the supply voltage VL is applied. Operation of the transistor may be controlled by applying a gate potential Vgate to a gate 33 of the transistor.

For example, the transistor may enter an on state (e.g., the linear mode of operation) when the gate-to-source voltage (Vgate-VL) is greater than or equal to a threshold voltage of the transistor.

The substrate voltage VSS may be applied to a heavily doped p+ region 38 of the substrate 37. An n-type isolation layer 36 may separate the substrate 37 from the backgate 34.

As shown in FIG. 4, the device 30 may include a second portion including a p-type region 310 and an n-type region 311, both located within an n-type well 340. The region 310 and the region 311 may be in substantial proximity to each other such that they respectively form the anode and cathode of a PN diode 39. In another example embodiment, the regions 310, 311 may be in contact with each other. The region 311 may be heavily doped (n+) relative to the isolation layer 36, to which it may be coupled. An isolation voltage Viso may be applied to the region 310. In this manner, the diode 39 is normally in an on state with a nominal voltage drop across the PN junction thereof and the isolation voltage Viso is transferred to the isolation layer 36. It will be appreciated that the diode 39 need not be limited to PN diodes. For example, in another example embodiment, the diode 39 may be a Schottky diode or any other switching device with the impedance characteristics described below.

Figure 5:
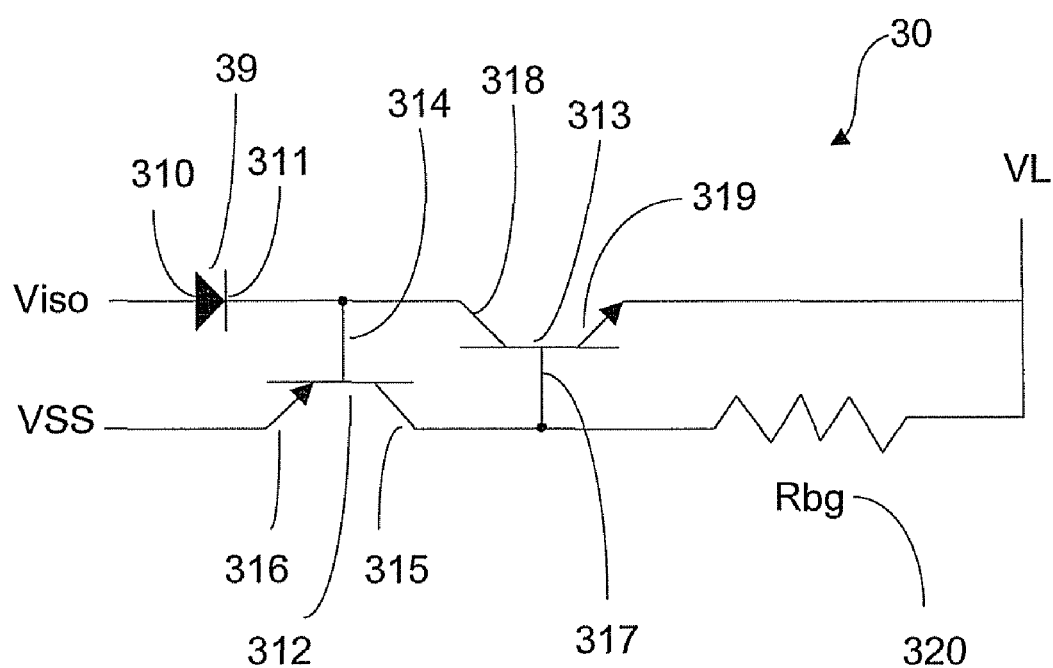
FIG. 5 shows a schematic view of a model of the semiconductor device of FIG. 4 including parasitic elements.

FIG. 5 shows a schematic view of the device 30. As shown in FIG. 5, the diode 39 may couple the isolation voltage Viso to a base 314 of a parasitic transistor 312 and a collector 318 of a parasitic transistor 313. A collector 315 of the transistor 312 and a base 317 of the transistor 313 may be coupled, via a parasitic backgate resistor Rbg 320, to the supply voltage VL. An emitter 319 of the transistor 313 may be directly coupled to the supply voltage VL. An emitter 316 of the transistor 312 may be directly coupled to the substrate voltage VSS. The transistors 312, 313 may respectively correspond to PNP and NPN transistors formed in a manner similar to that of the transistors 21, 22 previously described.

During an ESD event from either the source 31 or the drain 32 to Viso, no current may flow from the drain/source to the isolation layer 36 because the diode 39 is in a reverse-bias mode. That is, the voltage of the isolation layer 36 may be higher than Viso as opposed to the normal forward biasing of the diode 39 in which Viso is greater than the isolation layer voltage. During reverse biasing, the impedance of the diode 39 may be substantially higher compared to during forward biasing. This may result in strong resistance to the flow of current across the PN junction of the diode 39. Accordingly, an ESD discharge may be steered towards lower impedance (i.e., less resistive) paths such as another device connected to Vout.

During latchup conditions, the diode 39 may be forward biased and the impedance of the diode 39 is much less compared to during reverse biasing. The impedance may also be less than that of a conventional isolation resistor such as the resistor Riso 19 of FIG. 2. As a result, less voltage drop occurs across the diode 39. In order to drop the isolation voltage Viso below VSS, a higher trigger current may be required. Thus, it may be more difficult to place the transistor 312 into the forward active region and latchup performance is improved.

Figure 6:
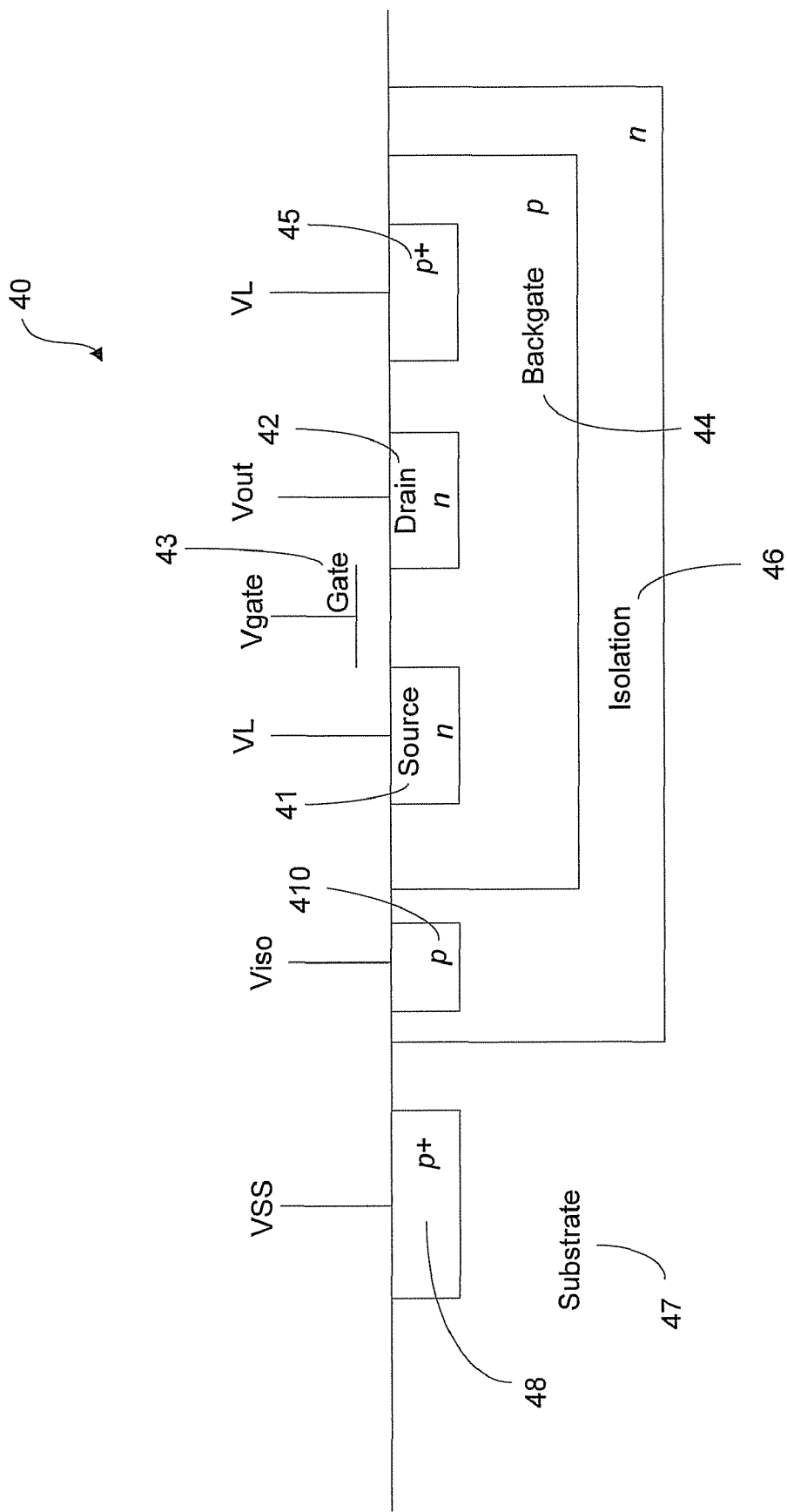
FIG. 6 shows another example semiconductor device according to an example embodiment of the present invention.

FIG. 6 shows a cross-sectional view of an example semiconductor device 40 according to an example embodiment of the present invention. The device 40 may include a first portion comprising an NMOS transistor formed within a p-type substrate 47. The transistor may include an n-type source 41 and an n-type drain 42 formed within a p-type backgate 44. A supply voltage VL may be applied to the source 41. An output voltage Vout may be produced by the drain 42. The backgate 44 may include a heavily doped p+ region 45 to which the supply voltage VL is applied. Operation of the transistor may be controlled by applying a gate potential Vgate to a gate 43 of the transistor.

A substrate voltage VSS may be applied to a heavily doped p+ region 48 of the substrate 47. An n-type isolation layer 46 may separate the substrate 47 from the backgate 44.

As shown in FIG. 6, the device 40 may include a PN diode formed by the combination of a p-type region 410 and the isolation layer 46. The PN diode of FIG. 6 may function in a manner substantially similar to that of the PN diode 39 of FIG. 4, except that the diode of FIG. 6 is formed within the isolation layer rather than as a separate diode. The region 410 may form an anode while the n-type isolation layer 46 may form a cathode. An isolation voltage Viso may be applied to the region 410.

Figure 7:
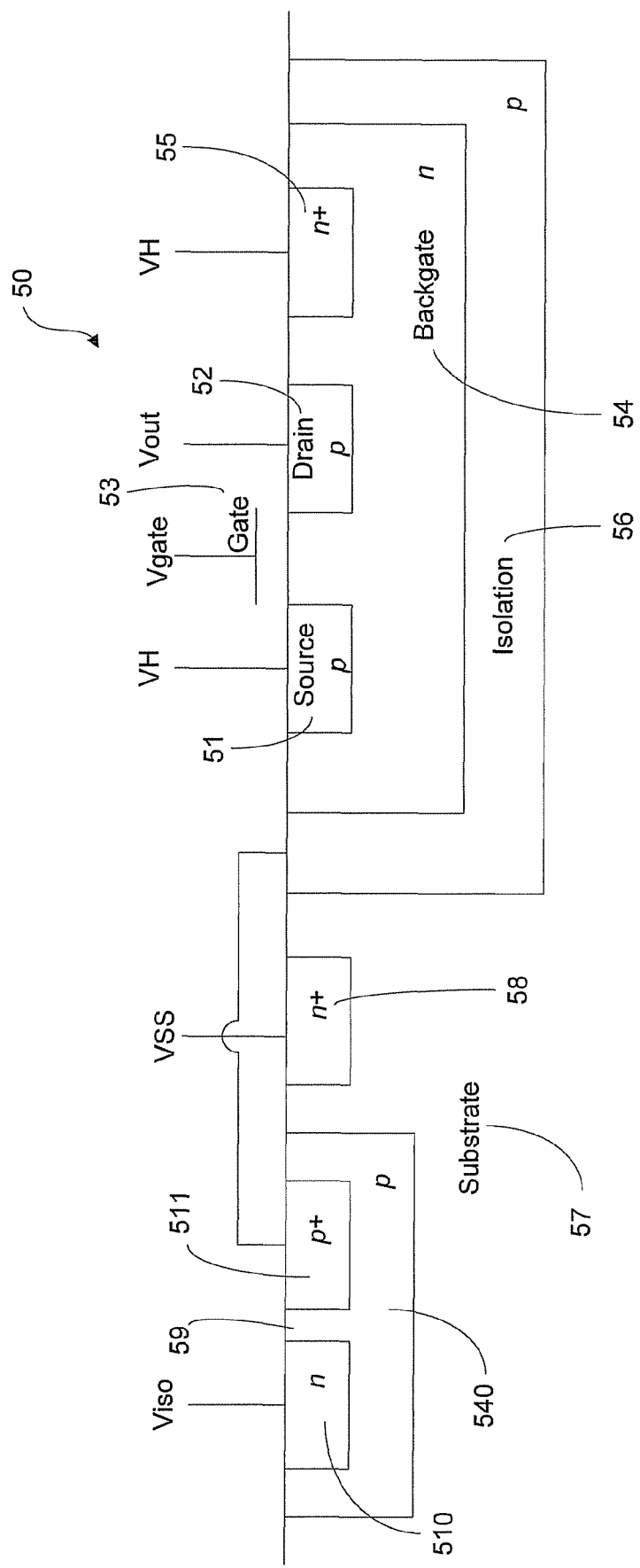
FIG. 7 shows another example semiconductor device according to an example embodiment of the present invention.

FIG. 7 shows a cross-sectional view of an example semiconductor device 50 according to an example embodiment of the present invention. The device 50 may include a first portion comprising a PMOS transistor formed within a n-type substrate 57. The transistor may include a p-type source 51 and an p-type drain 52 formed within an n-type backgate 54. A supply voltage VH may be applied to the source 51. An output voltage Vout may be produced by the drain 52. The backgate 54 may include a heavily doped n+ region 55 to which the supply voltage VH is applied. Operation of the transistor may be controlled by applying a gate potential Vgate to a gate 53 of the transistor.

The device 50 may include an n-type region 510 and a p-type region 511, both located within a p-type well 540. The region 510 and the region 511 may be in substantial proximity to each other such that they respectively form the cathode and anode of a PN diode 59. In another example embodiment, the regions 510, 511 may be in contact with each other. The region 511 may be heavily doped (p+) relative to an isolation layer 56, to which it may be coupled. An isolation voltage Viso may be applied to the region 510. In this manner, the diode 59 is normally in an off state and the isolation voltage Viso is prevented from being transferred to the isolation layer 56.

Figure 8:
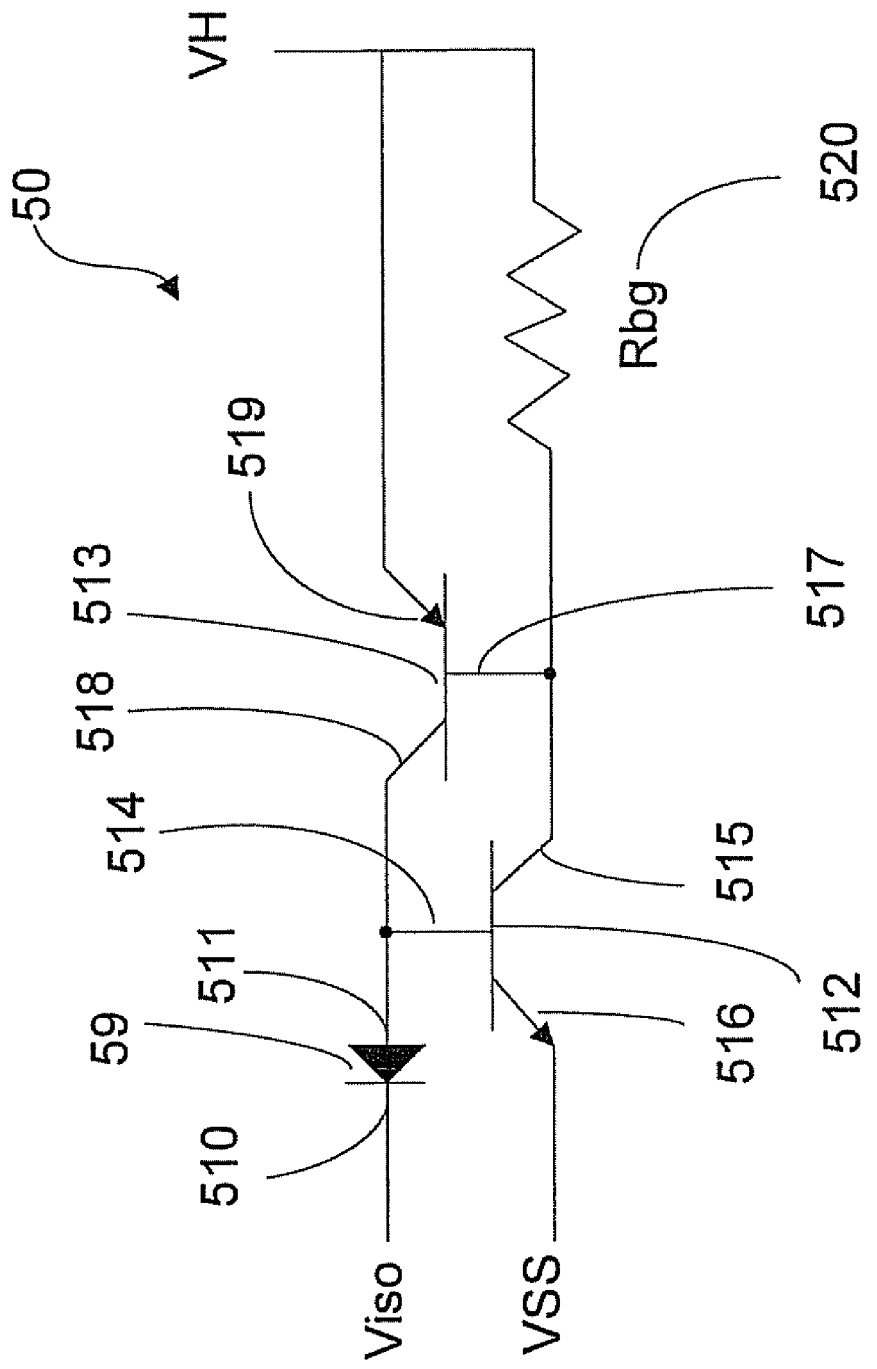
FIG. 8 shows a schematic view of a model of the semiconductor device of FIG. 7 including parasitic elements.

FIG. 8 shows a schematic view of the device 50. As shown in FIG. 8, the diode 59 may couple the isolation voltage Viso to a base 514 of a parasitic transistor 512 and a collector 518 of a parasitic transistor 513. A collector 515 of the transistor 512 and a base 517 of the transistor 513 may be coupled, via a parasitic backgate resistor Rbg 520, to the supply voltage VH. An emitter 519 of the transistor 513 may be directly coupled to the supply voltage VH. An emitter 516 of the transistor 512 may be directly coupled to the substrate voltage VSS. The transistors 512, 513 may respectively comprise NPN and PNP transistors. The collector 515 and the base 517 may correspond to the backgate 54. The collector 518 and the base 514 may correspond to the isolation layer 56. The emitter 516 may correspond to the substrate 57. The emitter 519 may correspond to the source 51.

The device 50 may be latchup and ESD resistant. During an ESD event from either the source 51 or the drain 52 to Viso, no current may flow from the drain/source to the isolation layer 56 because the diode 59 is in a reverse-bias mode. That is, the voltage of the isolation layer 56 may be lower than Viso as opposed to the normal forward biasing of the diode 59 in which Viso is lower than the isolation layer voltage. Reverse biasing may result in strong resistance to the flow of current across the PN junction of the diode 59. Accordingly, an ESD discharge may be steered towards lower impedance paths.

During latchup conditions (e.g., when 100 mA of current is injected into the drain 52), the diode 59 may be forward biased. Viso in this example may be a negative voltage source such that, when the diode 59 is forward biased, Viso lowers the potential of isolation layer 56, thereby preventing a high potential at the base 514 from activating the transistor 512.

Figure 9:
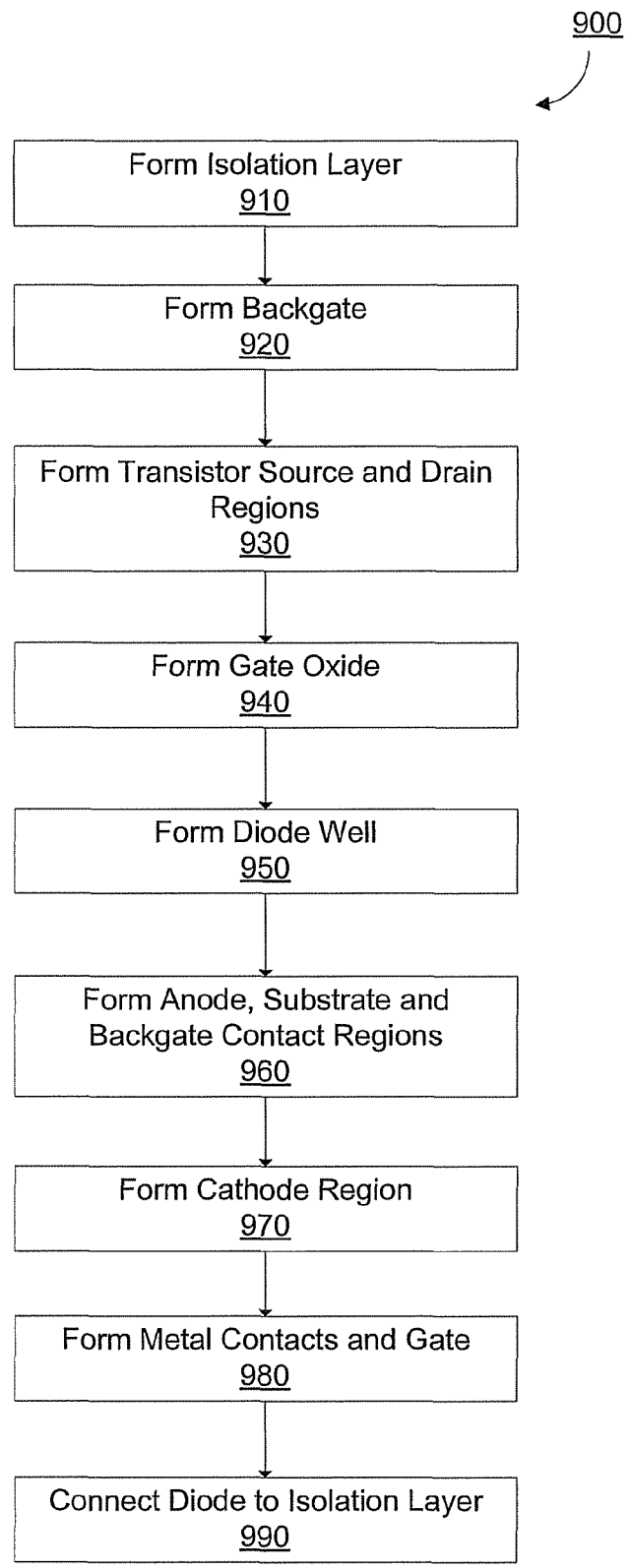
FIG. 9 shows an example method for constructing a semiconductor device according to an example embodiment of the present invention.

FIG. 9 shows an example method 800 for constructing a semiconductor device according to an example embodiment of the present invention. The method 900 will be described with reference to the semiconductor device 30 and may be performed using conventional semiconductor device processing techniques. It should be noted that the method 900 is exemplary and other methods may exist for constructing a semiconductor device according to the present invention. Therefore, the steps and the processing techniques described should be taken as exemplary rather than limiting. In 910, the isolation layer 36 may be formed over the substrate 37. The substrate 37 may be a silicon layer such as an intrinsically p-type polysilicon wafer. Standard lithography techniques such as wet or dry etching may be used to form a trough corresponding to the isolation layer 36, which may then be grown onto the surface of the trough by depositing an n-type element such as phosphorus or arsenic. Various deposition techniques such as evaporation or ion implantation may be used to grow the isolation layer 36.

In 920, the backgate 34 may be formed by depositing a p-type element such as aluminum or boron while covering the isolation layer 36 with an appropriate mask layer.

In 930, the source 31 and the drain 32 may be formed by forming troughs in the backgate 34 and filling in the troughs with an n-type element, which may or may not be the same n-type element used to form the isolation layer 36.

In 940, a gate oxide layer may be formed by subjecting the wafer to an oxidation procedure with a mask layer in which the gate area is exposed.

In 950, the n-type well 340 may be formed by etching a trough and depositing an n-type element.

In 960, the anode 310 may be formed along with the substrate contact region 38 and the backgate contact region 35. After the anode 310 is formed, the regions 35, 38 may be deposited with additional ions of the p-type element to form heavily doped p+ regions.

In 970, the cathode 311 may be formed by depositing additional n-type ions over the n-type well 340, thereby forming a heavily doped n+ region.

In 980, metal contacts may be formed over the regions 31, 32, 35, 38, 310 and 311, the isolation layer 36 and the gate 33, depending on whether the gate 33 is metal. If the gate 33 is formed of another material (e.g., polysilicon), a separate step to form the gate 33 may be performed.

In 990, the diode 39 may be connected to the isolation layer by applying a metal layer over the contacts of the cathode 311 and the isolation layer 36. The device 30 is now complete and may be tested or packaged. If other devices are to be formed on the substrate 37, the device 30 may be subjected to further processing It will be appreciated that other methods for constructing the device 30 may be possible. In another example method, the diode 39 may be formed integrally with the isolation layer 36 (e.g., similar to the PN diode previously described with reference to FIG. 6), thereby eliminating the need for a separate n-type well in which to deposit the anode 310 and the cathode 311. In yet another example method, the p and n regions of the diode 39 (e.g., the anode 310 and the cathode 311) may be formed simultaneously with p and n regions of the isolated NMOS transistor (e.g., the source 31 and the drain 32, and the backgate region 35). Accordingly, the method 900 is intended to be exemplary rather than limiting.

In the preceding specification, the present invention has been described with reference to specific example embodiments thereof. It will, however, be evident that various modifications and changes may be made thereunto without departing from the broader spirit and scope of the present invention as set forth in the claims that follow. The specification and drawings are accordingly to be regarded in an illustrative rather than restrictive sense.

What is claimed is:

1. A semiconductor device, comprising:
   a substrate layer;
   a metal-oxide-semiconductor field-effect transistor (MOSFET) including a gate region, a source region and a drain region;
   a backgate region including a voltage input terminal and in which the source region and the drain region are embedded;
   an isolation layer between the backgate region and the substrate layer, the isolation layer having a doping type opposite that of the backgate region; and
   a diode including a first terminal connected to the isolation layer and a second terminal connected to an isolation voltage source.

2. The semiconductor device of claim 1, wherein the MOSFET is one of a PMOS transistor and an NMOS transistor.

3. The semiconductor device of claim 1, wherein the first terminal has the same doping type as the isolation layer.

4. The semiconductor device of claim 3, wherein the first terminal is heavily doped relative to the isolation layer.

5. The semiconductor device of claim 1, wherein the diode is configured to be reversed-biased when an electrostatic discharge (ESD) occurs from one of the source region and the drain region to the isolation layer.

6. The semiconductor device of claim 1, wherein the diode is configured to be forward-biased when a trigger current is drawn from an output terminal of the MOSFET while the transistor is in an off state.

7. The semiconductor device of claim 1, wherein the diode is located within the substrate layer.

8. The semiconductor device of claim 1, wherein the first terminal is formed by the isolation layer.

9. The semiconductor device of claim 1, wherein the diode is a PN junction diode.

10. The semiconductor device of claim 9, wherein a PN junction of the diode is formed in a well having a doping type opposite that of the substrate layer.

11. The semiconductor device of claim 10, wherein P and N regions of the junction are separated by a portion of the well.

12. A method for constructing a semiconductor device, comprising:
    forming an isolation layer in a semiconductor substrate, the isolation layer having a doping type opposite that of the substrate;
    forming a backgate region on an outermost surface of the isolation layer such that the backgate region is separated from the substrate;
    forming a MOSFET including source and drain regions embedded within the backgate region; and
    forming a diode adjacent to the MOSFET, the diode including a first terminal connected to the isolation layer and a second terminal connected to an isolation voltage source.

13. The method of claim 12, wherein the MOSFET is formed as one of a PMOS transistor and an NMOS transistor.

14. The method of claim 12, wherein the first terminal has the same doping type as the isolation layer.

15. The method of claim 14, further comprising:
    heavily doping the first terminal relative to the isolation layer.

16. The method of claim 12, wherein the diode is configured to be reversed-biased when an electrostatic discharge (ESD) occurs from one of the drain region and the source region to the isolation layer.

17. The method of claim 12, wherein the diode is configured to be forward-biased when a trigger current is drawn from an output terminal of the MOSFET while the transistor is in an off state.

18. The method of claim 12, further comprising:
    placing the diode within the substrate.

19. The method of claim 12, further comprising:
    forming the first terminal as the isolation layer.

20. The method of claim 12, further comprising:
    forming the diode as a PN junction diode.

21. The method of claim 20, further comprising:
    forming a PN junction of the diode within a well having a doping type opposite that of the substrate.

22. The method of claim 21, further comprising:
    separating P and N regions of the junction by a portion of the well.

23. The method of claim 20, further comprising:
    respectively forming P and N regions of the diode at the same time as P and N regions of the transistor.

24. The method of claim 20, further comprising:
    forming P and N regions of the diode after forming P and N regions of the transistor.

* * * * *